(12) United States Patent
Chandesris et al.

(10) Patent No.: US 10,742,239 B2
(45) Date of Patent: Aug. 11, 2020

(54) METHOD FOR DECODING A POLAR CODE WITH INVERSION OF UNRELIABLE BITS

(71) Applicants: COMMISSARIAT À L'ÉNERGIE ATOMIQUE ET AUX ÉNERGIES ALTERNATIVES, Paris (FR); UNIVERSITE CERGY-PONTOISE, Cergy-Pontoise (FR); ECOLE NATIONALE SUPERIEURE DE L'ELECTRONIQUE ET DE SES APPLICATIONS (ENSEA), Cergy-Pontoise (FR)

(72) Inventors: Ludovic Chandesris, Grenoble (FR); David Declercq, Ableiges (FR); Valentin Savin, Grenoble (FR)

(73) Assignees: COMMISSARIAT À L'ÉNERGIE ATOMIQUE ET AUX ÉNERGIES ALTERNATIVES, Paris (FR); CY CERGY PARIS UNIVERSITÉ, Cergy-Pontoise (FR); ECOLE NATIONALE SUPERIEURE DE L'ELECRONIQUE ET DE SES APPLICATIONS (ENSEA), Cergy-Pontoise (FR)

(*) Notice: Subject to any disclaimer, the term of this patent is extended or adjusted under 35 U.S.C. 154(b) by 0 days.

(21) Appl. No.: 16/092,934

(22) PCT Filed: Apr. 12, 2017

(86) PCT No.: PCT/EP2017/058882
§ 371 (c)(1),
(2) Date: Oct. 11, 2018

(87) PCT Pub. No.: WO2017/178567
PCT Pub. Date: Oct. 19, 2017

(65) Prior Publication Data
US 2019/0132011 A1 May 2, 2019

(30) Foreign Application Priority Data

Apr. 15, 2016 (FR) .................................... 16 53339

(51) Int. Cl.
*H03M 13/00* (2006.01)
*H03M 13/45* (2006.01)
(Continued)

(52) U.S. Cl.
CPC ......... *H03M 13/458* (2013.01); *H03M 13/13* (2013.01); *H03M 13/09* (2013.01)

(58) Field of Classification Search
CPC ..... H03M 13/458; H03M 13/13; H03M 13/09
See application file for complete search history.

(56) References Cited

U.S. PATENT DOCUMENTS

| 2014/0365842 A1* | 12/2014 | Li | H03M 13/09 714/752 |
| 2016/0013810 A1* | 1/2016 | Gross | H03M 13/09 714/776 |
| 2018/0262211 A1 | 9/2018 | Savin et al. | |

OTHER PUBLICATIONS

International Search Report for International Application No. PCT/EP2017/058882, dated Jul. 20, 2017.
(Continued)

*Primary Examiner* — Samir W Rizk
(74) *Attorney, Agent, or Firm* — Pearne & Gordon LLP

(57) ABSTRACT

A polar code decoding method in which a first decoding attempt by successive cancellation is performed and in the case where the decoded frame is erroneous, an ordered list of bit positions to be tested in the frame is generated, the order relation being given by a metric of first error, the value of this metric depending on the reliability of the decision about the bit as well as on the reliability of the decisions about the bits preceding it in the frame. For each of the positions of the list, an inversion of the bit and a decoding
(Continued)

of the subsequent bits are undertaken, doing so as long as the list has not been exhausted or the frame has not been decoded without error. In case of failure, a new decoding attempt based on a double-inversion of bits can be envisaged.

16 Claims, 8 Drawing Sheets

(51) Int. Cl.
*H03M 13/13* (2006.01)
*H03M 13/09* (2006.01)

(56) References Cited

OTHER PUBLICATIONS

Written Opinion for International Application No. PCT/EP2017/058882, dated Jul. 20, 2017.

Preliminary French Search Report for Application No. 16 53339, dated Feb. 16, 2017.

Afisiadis, Orion et al, "A low-complexity improved successive cancellation decoder for polar codes", 2014 48th Asilomar Conference on Signals, Systems, and Computers, IEEE, Nov. 2, 2014, pp. 2116-2120.

Zhang, Zhaoyang et al, "A Split-Reduced Successive Cancellation List Decoder for Polar Codes", IEEE Journal on Selected Areas in Communications, IEEE Service Center, Piscataway, US, vol. 34, No. 2, Feb. 2016, pp. 292-302.

Arikan, Erdal et al, : Channel polarization: A method for constructing capacity-achieving codes for symmetric binary-input memoryless channels IEEE, Jul. 20, 2009, pp. 1-23.

Tal, Ido et al, "List Decoding of Polar Codes" IEEE, May 31, 2012, pp. 1-11.

\* cited by examiner

METHOD FOR DECODING A POLAR CODE WITH INVERSION OF UNRELIABLE BITS

CROSS-REFERENCE TO RELATED APPLICATIONS

This is a National Stage application of PCT international application PCT/EP2017/058882, filed on Apr. 12, 2017, which claims the priority of French Patent Application No. 16 53339, filed Apr. 15, 2016, both of which are incorporated herein by reference in their entirety.

TECHNICAL DOMAIN

This invention relates to the field of error correction codes in general, and more particularly to the field of polar codes.

STATE OF PRIOR ART

Polar codes are a family of error correction codes that have the remarkable property that they can reach the Shannon capacity of any memoryless symmetric binary channel asymptotically, in other words when the code length becomes infinite.

Polar codes have been introduced and described in the paper by E. Arikan entitled "Channel polarization: a method for constructing capacity-achieving codes for symmetric binary-input memoryless channels" published in IEEE Trans on Information Theory, Vol. 55, No. 7, pp. 3051-3073. The principal characteristics of polar codes are summarised below.

In the following we will describe the polar codes on a symmetric MBS (Memoryless Binary Channel) denoted W. This channel is characterised by its input alphabet $\mathcal{X}=\{0,1\}$, its output alphabet $\mathcal{Y}$ and its transition probabilities $W(y|x)$. Consequently, the vector channel composed of N successive uses of channel W is denoted $W^N$, and can transmit words of N bits. The vector channel $W^N : \mathcal{X}^N \to \mathcal{Y}^N$ is characterised by its input alphabet $\mathcal{X}^N$, its output alphabet $\mathcal{Y}^N$ and its transition probabilities, that are nothing more than $$W^N(y_1^N \mid x_1^N) = \prod_{i=1}^{N} W(y_i \mid x_i)$$

in which $y^N=(y_1, \ldots, y_N) \in \mathcal{Y}^N$ and $x^N=(x_1, \ldots, x_N) \in \mathcal{X}^N$. It is assumed in the following that $N=2^n$.

A virtual channel $W_N: \mathcal{X}^N \to \mathcal{Y}^N$ is synthesised recursively, starting from the elementary channel W, in other words the order 1 virtual channel is simply the real channel W : $W_1=W$. The order 2 virtual channel, $W_2: \mathcal{X}^2 \to \mathcal{Y}^2$ obtained after a first iteration is given by:

$$W_2(y_1,y_2 \mid u_1 u_2) = W(y_1 \mid u_1 \oplus u_2) W(y_2 \mid u_2) \quad (1)$$

that can also be written in an equivalent manner from the vector channel $W^2$:

$$W_2(y_1^2 \mid u_1^2) = W^2(y_1^2 \mid u_1^2 G_2) \quad (2)$$

in which $y_1^2=(y_1,y_2) \in \mathcal{Y}^2$, $u_1^2=(u_1,u_2) \in \mathcal{X}^2$, and:

$$G_2 = F = \begin{pmatrix} 1 & 0 \\ 1 & 1 \end{pmatrix} \quad (3)$$

FIG. 1A diagrammatically represents the order 2 virtual channel obtained from the real channel. Similarly, the order 4 virtual channel can be obtained after a second iteration as shown in FIG. 1B, following a changeover step $R_4$.

In general, the order N virtual channel, $W_N: \mathcal{X}^N \to \mathcal{Y}^N$ is constructed from the vector channel $W^N$:

$$W_N(y_1^N \mid u_1^N) = W^2(y_1^N \mid u_1^N G_N) \quad (4)$$

in which $y_1^N=(y_1, \ldots, y_N) \in \mathcal{Y}^N$, $u_1^N=(u_1, \ldots, u_N) \in \mathcal{X}^N$, and $G_N=B_N F^{\oplus n}$ and in which $B_N$ is a permutation matrix called a bit reversal changeover matrix and $F^{\oplus n}$ is the $n^{th}$ Kronecker power of the matrix F.

Construction of a polar code is based on a selection of K among the $2^n$ binary virtual sub-channels $W_N^{(i)}: \mathcal{X} \to \mathcal{Y}^N \times \mathcal{X}^{i-1}$, $i=1, \ldots, N$ defined by:

$$W_N^{(i)}(y_1^N, u_1^{i-1} \mid u_i) = \sum_{u_{i+1}^N \in \mathcal{X}^{N-i}} \frac{1}{2^{N-1}} W_N(y_1^N \mid u_1^N) \quad (5)$$

the channel input being given by $u_i \in \mathcal{X}$ and the output by $(y_1^N, u_1^{i-1}) \in \mathcal{Y}^N \times \mathcal{X}^{i-1}$. In other words, the binary virtual sub-channel $W_N^{(i)}$ is a channel for which bit $u_i$, is estimated from the observed vector $y_1^N$ at the output from channel $W_N$ and auxiliary information composed of i-1 previous estimates $(\hat{u}_1, \ldots, \hat{u}_{i-1})$ assumed to be correct.

The advantage of polar codes is the result of a so-called polarisation phenomenon. More precisely, when the code size N increases, the capacity of some of the above-mentioned binary virtual sub-channels tends towards 1 while the capacity of others tends towards 0. The construction of a polar efficiency code R=K/N consists of choosing K binary virtual sub-channels among those with the highest capacity (in other words the channels that are polarised towards 1). The K selected sub-channels transmit the K information bits and the bits at the input to the N-K remaining sub-channels are fixed at pre-determined values known to the transmitter and the receiver. For simplification reasons, the bits at the input to these N-K sub-channels are conventionally taken to be equal to zero.

FIG. 2 diagrammatically represents an example of a coding and decoding system for a size N=8, K=4 polar code, therefore with efficiency 1/2.

The polar code 210 receives the K bits to be transmitted on channel W. Module 211 makes a selection of K binary virtual sub-channels with the highest capacity to transmit the K information bits $b_1,b_2,b_3,b_4$. The remaining NK bits are fixed at zero. The resultant vector, $u_1^8$, is subjected to a linear transformation $x_1^8=u_1^8 G_8$ in module 213, in which $G_8$ is given by the expression (5).

The 8-bit word at the output from the linear combination module is then transmitted on the vector channel $W^8$, 220, in other words the bits $x_1, \ldots, x_8$ are transmitted successively on channel W.

The decoder 230 receives noisy values from the transmitted bits, denoted $y_1, \ldots, y_8$ and expresses them in logarithmic likelihood ratios (LLR).

Different decoding algorithms have been proposed in the literature. However, the Successive Cancellation (SC) algorithm is still the fundamental algorithm for decoding polar codes in that all the highest performance decoding algorithms still use the structure and the sequential nature of this type of decoding.

A description of SC decoding of polar codes can be found in the paper mentioned above by E. Arikan. The principle of SC decoding is given below. The first step is to estimate the first bit $u_1$ starting from the vector of received values, $y_1^N=(y_1, \ldots, Y_N)$, namely $\hat{u}_1$, the first estimated bit. The second bit $u_2$ is then estimated from $y_1^N$ and $\hat{u}_1$, namely $\hat{u}_2$ the second estimated bit. The process is repeated by estimating the third bit $u_3$ starting from $y_1^N$, $\hat{u}_1$, $\hat{u}_2$ and so on. Considering that N-K bits are fixed and known to the decoder, only the K information bits actually need to be estimated. The next step is to define logarithmic likelihood ratios $W_N^{(i)}(y_1^N,\hat{u}_1^{i-1}|u_i)$ by:

$$L_N^{(i)}(y_1^N, \hat{u}_1^{i-1} \mid u_i) = \log \frac{W_N^{(i)}(y_1^N, \hat{u}_1^{i-1} \mid u_i = 0)}{W_N^{(i)}(y_1^N, \hat{u}_1^{i-1} \mid u_i = 1)} \quad (6)$$

The LLR value $L_N^{(i)}(y_1^N,\hat{u}_1^{i-1}|u_i)$ expresses the reliability of the estimate of the value of bit $u_i$, taking account of the vector of received values $y_1^N$ and the vector of previously decoded bits, in other words hard decisions made on the preceding bits $\hat{u}_1^{i-1}=(\hat{u}_1, \ldots, \hat{u}_{i-1})$. The hard decision made on the current bit is given by:

$$\hat{u}_i=0 \text{ si } L_N^{(i)}(y_1^N, \hat{u}_1^{i-1}|u_i) \geq 0 \text{ and } i \in A \quad (7\text{-}1)$$

$$\hat{u}_i=1 \text{ if } L_N^{(i)}(y_1^N,\hat{u}_1^{i-1}|u_i)<0 \text{ and } i \in A \quad (7\text{-}2)$$

$$\hat{u}_i=u_i \text{ if } i \in A_c \quad (7\text{-}3)$$

in which $A_c$ is the set of indices of N-K fixed bits and A is the set of indices of K information bits. In practice, LLR values can be calculated by propagation in a graph containing constraint nodes and variable nodes for each decoding step i. Bits $u_1, \ldots, u_N$ are thus estimated step by step.

The weak point of decoding by successive cancellation is inherent to its sequential nature. If a wrong decision on a bit is made, the error can be propagated while decoding subsequent bits. The conventional SC decoder does not go backwards to correct an incorrect decision.

Different approaches have been proposed to overcome propagation of errors in SC decoding.

A first approach consists of using list decoding, in other words keeping a plurality of most probable paths at each decoding step (up to a maximum number) L) in the decoding tree structure at each decoding step instead of keeping only one in the SC decoding. Selection of the best path at the end of the decoding method gives an estimate of the most probable transmitted word.

A description of successive list decoding of polar codes is given in the paper by I. Tal et al. entitled "List decoding of polar codes", Information Theory Proc. (ISIT), July 2011, pp. 1-5.

FIG. 3 diagrammatically shows an example of successive list decoding of a polar code.

Decisions to be made successively on bits $\hat{u}_1, \ldots, \hat{u}_8$ are shown on the first line in the order of the successive cancellation decoder. When a decision on a bit is considered to be insufficiently reliable, the two paths corresponding to the two possible values of the bit are kept and decoding continues in parallel for the two paths. At the end of decoding, there is no longer a single candidate word but a plurality (a maximum of L) of candidate words, in which L is a parameter fixed in advance. The best candidate in the list is selected by means of a metric or a verification by means of a CRC type error detection code.

Performances of the SC list (SCL) decoder are significantly better than performances of the SC decoder and are similar to those of the maximum likelihood (ML) decoder when the list size (L) is large enough and the best candidate is selected in the list by means of a CRC type error detection code. However, the SCL decoder is relatively complex (complexity L times higher than the complexity of the SC decoder) and is demanding in resources (calculation and memory).

A second approach provides a trade-off in terms of complexity and performances between the SC decoder and the SCL decoder. According to this approach, instead of keeping several paths as in the SCL decoder, a backward step on the path of the SC decoder is allowed until an error is detected at the end of decoding. A CRC (Cyclic Redundancy Check) code is added to the polar decoder for this purpose. At the end of decoding, if the CRC is not null and therefore the decoded word is incorrect, the least reliable decision made on the successive cancellation decoding path is inverted and the values of subsequent bits are then estimated again, taking account of the inversion made. If the CRC is still not null after this new decoding, the second least reliable decision is chosen and the process is repeated.

Decoding is complete when the CRC check is positive, namely when a predetermined maximum number of inversions, $M_{max}$, parameter of the decoder, is reached.

A description of inversion decoding is given in the paper by de O. Afisiadis et al. entitled "A low-complexity improved successive cancellation decoder for polar codes' published in Signals, Systems and Computers, 2014, 48th Asilomar Conference, pp. 2116-2120.

The inversion decoding method is represented diagrammatically on FIG. 4.

During a first step, 410, a conventional successive cancellation decoding (SC decoding) is done.

A test is made at the end of this decoding in 420 to see if the CRC check is satisfied. If it is, the decoded word is assumed to be correct and the process stops in 490. If it is not, the decoded word is necessarily incorrect and the process continues at step 430.

An ordered list, $L_{flip}$, of indices of candidate inversion bits is generated in step 430. This list with maximum length $M_{max}$, contains indices for which the logarithmic likelihood ratios (LLR) have the least reliable absolute values. The indices are stored in increasing order of absolute value of the LLR value.

In step 440, a pointer is initialised to the first element of the list $L_{flip}=\{i_1, \ldots, i_{M_{max}}\}$, in other words m=1.

In step 450, the decision pointed to by the current position of the pointer m in the list is inverted, in other words the value of the corresponding bit is changed, $\hat{u}_{i_m}$ and a new decoding of subsequent bits is made in 460 using this new value.

Another test to check whether the CRC is null is made in step 470. If this is the case, the decoded word is assumed to be correct and the process is terminated at 490. Otherwise, it is tested if the value of the pointer is equal to m=$M_{max}$, in 480.

In the negative, the value of the pointer is incremented in 485 and the process returns to step 450. In any case, note that only one inversion is made if the CRC is incorrect. In other words, the inverted bit is restored to its initial value if the CRC is not null.

In the affirmative, in other words if the maximum number of inversions to be tested has been reached, the decoding is declared to be incorrect in 487 and the process is terminated in 490.

The performance of the inversion decoder is dependent on the maximum number of inversions to be tested, $M_{max}$, and the size of the CRC. Simulations show that a very high value $M_{max}$ has to be chosen to reach the theoretical Frame Error Rate FER or Bit Error Rate (BER) bit ( )limit of such a decoder. On the other hand, this considerably increases the number of inversions made and therefore the complexity of decoding, and the probability of collision of the CRC, in other words the probability that incorrect decoding passes the CRC check and is consequently declared as being correct.

Consequently the purpose of this invention is to disclose a method of decoding polar codes by successive cancellation that can achieve error rates significantly lower than rates obtained in the state of the art, with a significantly lower degree of complexity.

PRESENTATION OF THE INVENTION

This invention is defined by a polar code decoding method as described in claim 1. Advantageous embodiments are defined by the dependent claims.

BRIEF DESCRIPTION OF THE DRAWINGS

Other features and advantages of the invention will become clear after reading preferred embodiments of the invention, with reference to the appended figures among which.

DETAILED PRESENTATION OF PARTICULAR EMBODIMENTS

This invention is based on an inversion decoding method in which the choice of the position to be cancelled is not made according to a criterion expressing the fact that the bit in question is less reliable than the received frame as in the state of the art, but according to a criterion based on the probability that this bit is the first incorrect bit in this frame. If an incorrect decision is made on a bit during successive cancellation decoding, whereas this bit was not necessarily the least reliable in the frame (in other words the bit with the lowest absolute value of the LLR), the decisions made on subsequent bits will then very probably be incorrect. Thus, when a frame is detected as being incorrect, for example by using a CRC, it is more important to determine the first incorrect bit in the frame rather than the one having the lowest degree of reliability. This invention proposes that an ordered list of positions to be cancelled should be obtained from a new metric. For a given position in the frame, the metric takes account not only of the reliability of the decision on the bit at the position in question, but also on decisions made on at least some of the bits preceding it in the frame.

Figure 5:
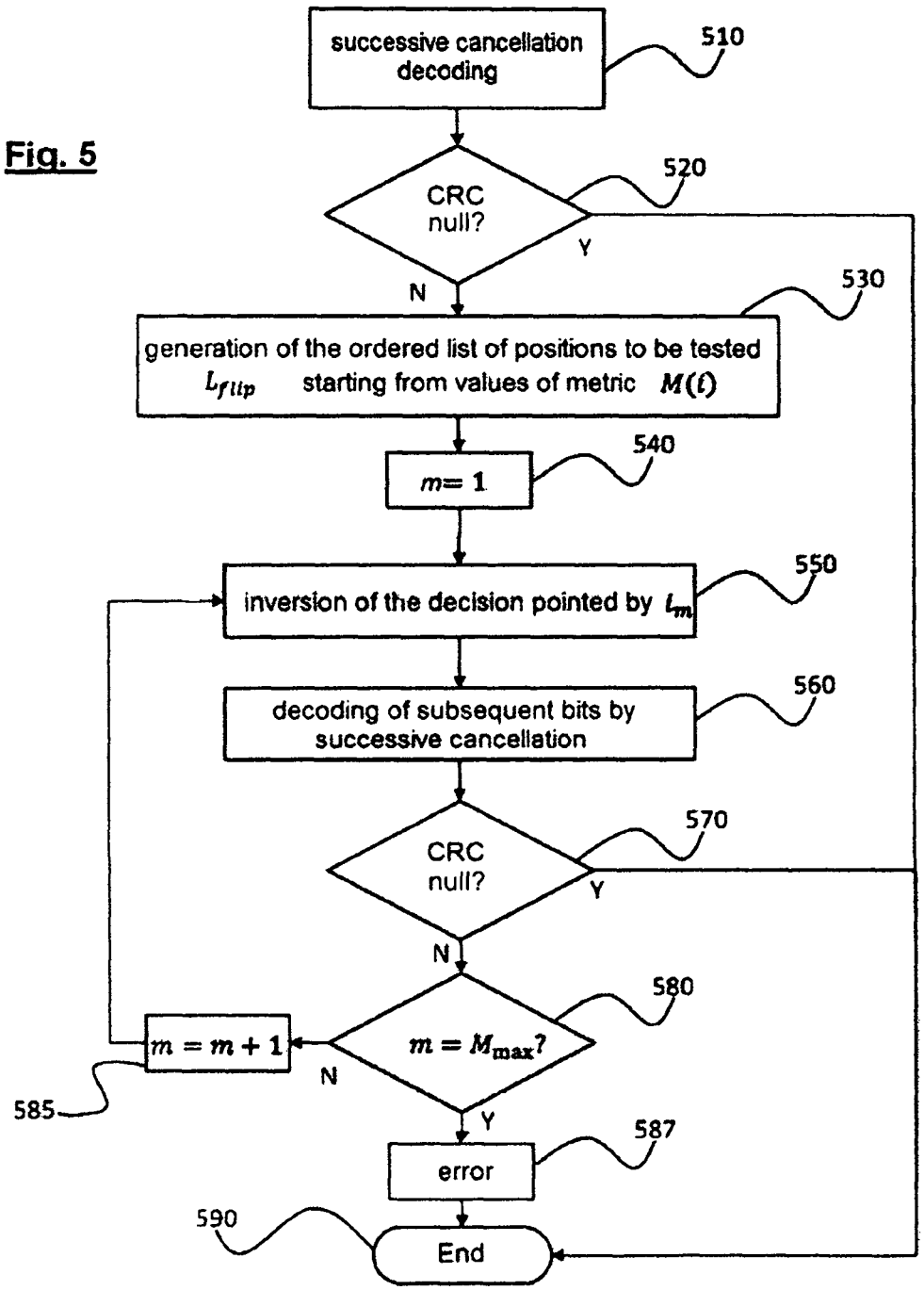
FIG. 5 diagrammatically represents a flowchart of a polar code decoding method according to a first embodiment of the invention.

More precisely, FIG. 5 diagrammatically represents the flowchart of a polar code decoding method according to a first embodiment of the invention.

Except for step 530, steps 510 to 590 are identical to steps 410 to 490 and therefore they will not be described again herein.

Step 530, like step 430, generates an ordered list, $L_{flip}$, of positions to be inverted if the CRC check fails. However, this list is constructed from a new metric, referred to in the following as the first error metric. This metric takes account of the reliability of the decoded bit, but also of all previously decoded bits, or even only of a subset of them. The first error metric can generally be written in the following form:

$$M(k)=F(|LLR(k)|;|LLR(1)|,\ldots,|LLR(k-1)|) \quad (8)$$

in which F is a monotonous function of absolute values $|LLR(1)|,\ldots,|LLR(k)|$ or of only some of them.

According to a first variant, the first error metric is expressed in the following form:

$$M(k)=|LLR(k)|+\alpha.S.\text{Card }\{i \in [1,\ldots,k-1], |LLR(i)|<S\} \quad (9)$$

in which S>0 is a threshold below which a bit is considered to be not reliable and $0<\alpha\leq 1$ is a weighting factor. The first term of the metric gives the degree of reliability of bit k, the second term gives the number of bits preceding bit k considered as being doubtful, in other words for which the reliability is considered to be insufficient. Note that the absolute LLR values can generally be replaced by reliability measures of the decoded bits, without going outside the framework of this invention.

When the metric (9) is adopted, the ordered list $L_{flip}$ is obtained in step 530, as indicated below.

In the first step, a list, $L_S$, is generated containing the indices of all bits (in the same way as for the list of all positions) of the frame for which the absolute LLR value is less than the threshold S, namely:

$$L_S=\{j \in [1,\ldots,N], |LLR(j)|<S\}=\{j_1,\ldots,j_M, 1\leq j_1<j_2<\ldots<j_M\leq N\} \quad (10)$$

in which M is the number of bits considered to be not reliable.

Secondly, each bit in the list is penalised by the number of doubtful bits preceding it. More precisely, the first decoded bit in the list $L_S$, with index $j_1$, is assigned the value of metric $|LLR(j_1)|$, the second, with index $j_2$, is assigned the value of metric $|LLR(j_2)|+\alpha S$ and so on. Thus, in general, the $m^{th}$ bit in the list is assigned the value of metric:

$$M(j_m)=|LLR(j_m)|+(m-1)\alpha S \quad (11)$$

The list $L_{flip}$ is obtained from the list $L_S$ by ordering the indices $j_1, \ldots, j_M$ according to increasing metric values and only selecting the $M_{max}$ first indices thus ordered, namely $L_{flip} = \{i_1, \ldots, i_{M\ max}\}$ The weighting factor $\alpha$ expresses the relative weight assigned to the reliability of the bit and its rank in the list of bits with low reliability. The weighting factor $\alpha$ can be optimised by simulation.

Figure 6:
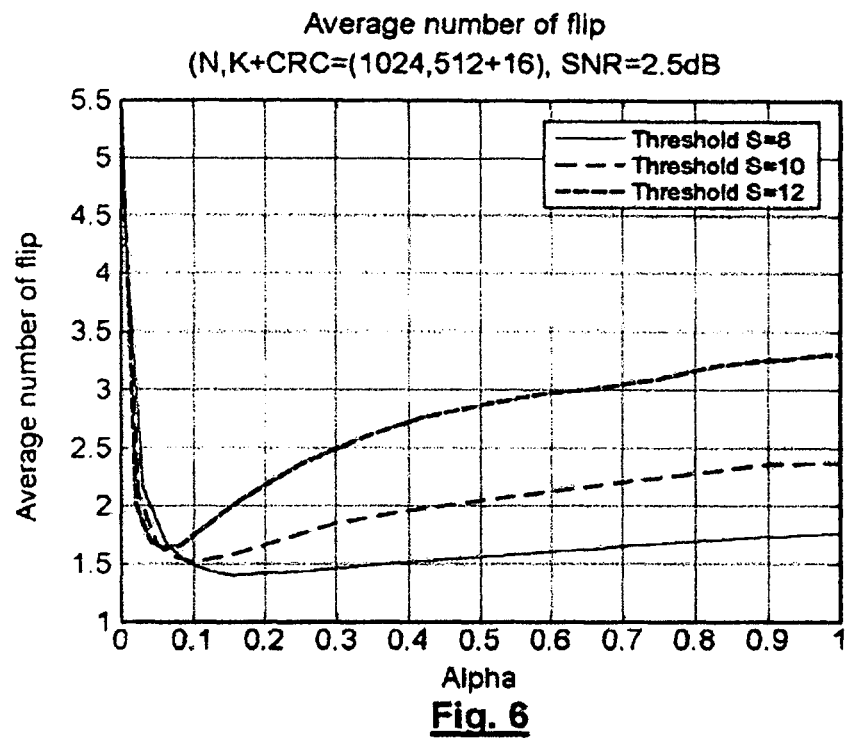
FIG. 6 represents the average number of inversions as a function of a weighting factor of the decoding method according to a first embodiment of the invention.

FIG. 6 represents the average number of inversions as a function of the weighting factor $\alpha$ for different threshold values S. The polar code is chosen to have a size N=1024, the number of information bits is K=512 (code efficiency 1/2), the CRC size is 16.

The number of inversions made to obtain correct decoding decreases for small values of $\alpha$ and then increases slowly. It is empirically observed that the optimum weighting factor corresponding to the smallest number of iterations is given by:

$$\alpha_{opt} \approx 1/S \quad (12)$$

According to a second variant, the first error metric is in the following form:

$$M(k) = |LLR(k)| + \alpha \cdot \sum_{i=1}^{k-1} \exp(-\beta|LLR(i)|) \quad (13)$$

in which $\alpha>0$ is a weighting factor and $\beta>0$ is a forgetting factor. As in the first variant, the second term of this metric can penalise a position depending on the number of unreliable decisions made before it. However, unlike the first variant, it does not introduce a threshold effect and does not exclude any previous decision. Therefore in practice, no intermediate list is constructed, $L_S$, but initially all positions in the frame are taken into account. The list $L_{flip}$ is then obtained by ordering the indices $1, \ldots, N$ according to increasing metric values and only selecting the $M_{max}$ first indices thus ordered.

According to a third variant, the first error metric is in the following form:

$$M(k) = \frac{1}{1+e^{\alpha|LLR(k)|}} \prod_{i=1}^{k-1} \frac{1}{1+e^{-\alpha|LLR(i)|}} \quad (14)$$

in which $\alpha$ is a weighting vector.

This metric corresponds to the probability that the bit at position k, $\hat{u}_k$ is the first error in the frame.

The probability that bit $\hat{u}_k$ is the first error is given by:

$$Pr(\hat{u}_k\ 1st\ error) = p_{err}(k) \prod_{i=1}^{k-1}(1-p_{err}(i)) \quad (15)$$

in which $p_{err}(k)=Pr(\hat{u}_k \neq u_k | y_1^N, \hat{u}_1^{k-1}=u_1^{k-1})$ is the probability that bit $u_k$ is incorrectly decoded, that depends on the received sequence and the assumption that the preceding bits (elements of vector $\hat{u}_1^{k-1}$) were decoded correctly.

It can be shown that the probability of error $p_{err}(k)$ can be approximated by:

$$p_{err}(k) = \frac{1}{1+e^{\alpha|LLR(k)|}} \quad (16)$$

which, considering (15), gives expression (14). It will be noted that in this case, the indices $\{1, \ldots, N\}$ will have to be sorted by decreasing metric values in the list $L_{flip}$.

To simplify the calculation of metric values in expression (14), we can manage by only performing this calculation for LLR values with a sufficiently small absolute value, in other words for the least reliable bits.

In practice, in a hardware implementation, LLR values calculated during decoding are still quantified on a predetermined number of bits. In this case, the density variation method can be used to demonstrate that the error probability $p_{err}(k)$ can be approximated by:

$$p_{err}(k) = \frac{f_k(-|LLR(k)|)}{f_k(-LLR(k))+f_k(LLR(k))} \quad (17)$$

in which $f_k(x)=Pr\ (LLR(k)=x)$ is the Probability Mass Function (PMF) ( )of the discrete random variable LLR(k), considered to be quantified on a predetermined number of bits. In this case, the first error metric can be expressed according to (15) by:

$$M(k) = \frac{f_k(-|LLR(k)|)}{f_k(-LLR(k))+f_k(LLR(k))} \prod_{i=1}^{k-1} \frac{f_i(-|LLR(i)|)}{f_i(-LLR(i))+f_i(LLR(i))} \quad (18)$$

Once again, to simplify the calculation of metric values, we can manage by only performing this calculation for LLR values with a sufficiently small absolute value, in other words for the least reliable bits.

In this case, the first metric value can be obtained in a simplified manner by:

$$M'(k) = \quad (19)$$

$$\begin{cases} 0 & \text{if } |LLR(k)|>S \\ \frac{f_k(-|LLR(k)|)}{f_k(-LLR(k))+f_k(LLR(k))} \prod_{i\in\Omega_k} \frac{f_i(-|LLR(i)|)}{f_i(-LLR(i))+f_i(LLR(i))} & \text{otherwise} \end{cases}$$

in which $\Omega_k$ is the set of indices i<k such that $|LLR(i)|\leq S$. It will thus be understood that only bits that are insufficiently reliable are used in the calculation of the metric (19). As in the case of (14) and (18), it will be noted that the indices $\{1, \ldots, N\}$ must be sorted by decreasing metric values in the list $L_{flip}$.

The performances of an inversion decoder can be characterised by two parameters:
the average number of inversions when an error is detected (CRC not verified). The decoding latency increases as this number increases;
the "order 1 loss ratio", namely the difference from a perfect inversion decoder. This decoder corresponds to a maximum number of inversions $M_{max}=K$ and an infallible CRC. The performance of the perfect decoder then only depends on the channel, the size N of the polar code, and the number K+r in which r is the number of bits of the CRC.

Figure 7:
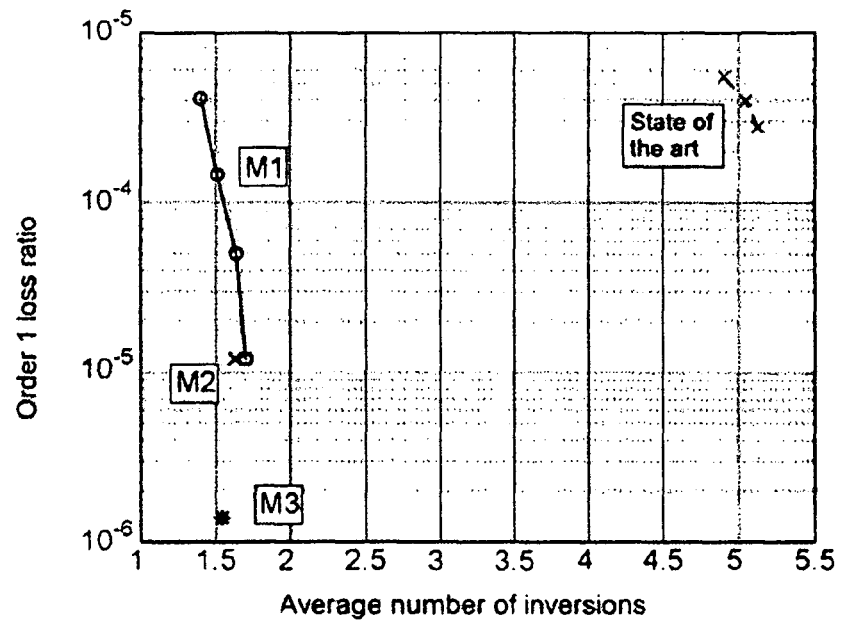
FIG. 7 represents the difference from perfect inversion decoding for the decoding method according to the first embodiment of the invention and a decoding method according to the state of the art.

FIG. 7 represent an order 1 loss ratio as a function of the number of inversions for a polar code decoding method according to the first embodiment of the invention and the SC inversion decoding method known from the state of the art.

In this case, a polar code with length N=1024 is considered, with a number of information bits K=512, a size 16 CRC and a signal-to-noise ratio SNR=2.5 dB on an additive Gaussian noise channel.

The performances of SC inversion decoding according to the state of the art have been represented for three examples of the maximum number of inversions $M_{max}=\{30,35,40\}$.

The polar code decoding method according to the first embodiment of the invention has been represented for:
- a metric ($M_1$) according to the first variant as defined by expression (9), with examples of threshold values S=\{8,10,12,14\} and for $M_{max}=20$ and $\alpha=1/S$;
- a metric ($M_2$) according to the second variant as defined by expression (13), with $M_{max}=20$, $\alpha=1.5$ and $\beta=0.2$;
- a metric ($M_3$) according to the third variant as defined by expression (14), with $M_{max}=20$ and $\alpha=0.3$;

It will be noted that, regardless of the metric envisaged, the average number of inversions is significantly lower than that observed in prior art.

The metric $M_1$ makes it possible to aim at a very small number of inversions at the price of an order 1 loss ratio comparable to or less than that observed in the state of the art (gain in terms of latency). The metric $M_2$, and especially the metric $M_3$, can achieve a very low order 1 loss combined with a small number of iterations, all at the price of complexity slightly higher than that of the metric $M_1$.

Figure 8A:
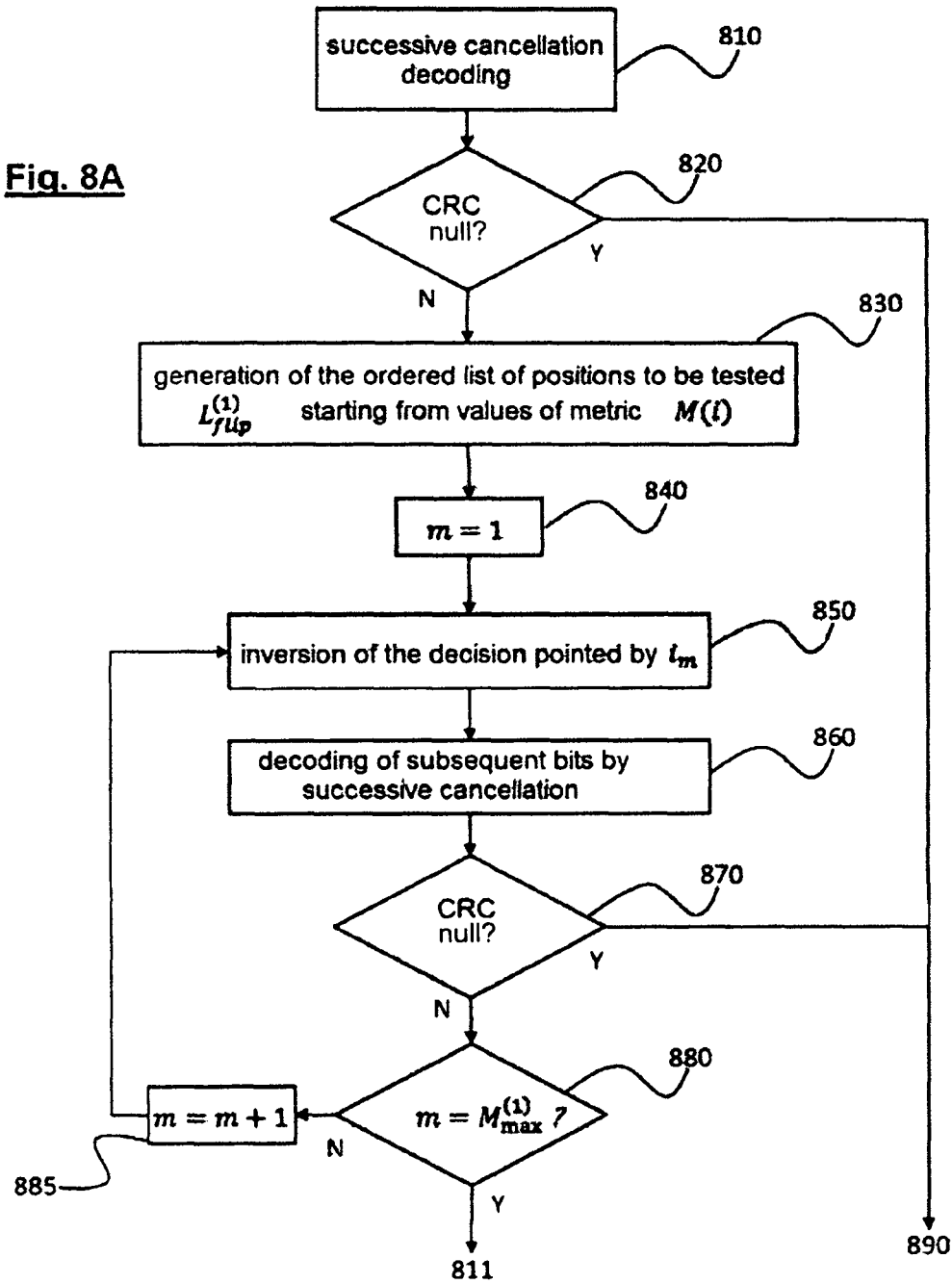
FIGS. 8A and 8B represent a flow chart of the first and the second passes of a polar code decoding method according to a second embodiment of the invention.
Figure 8B:
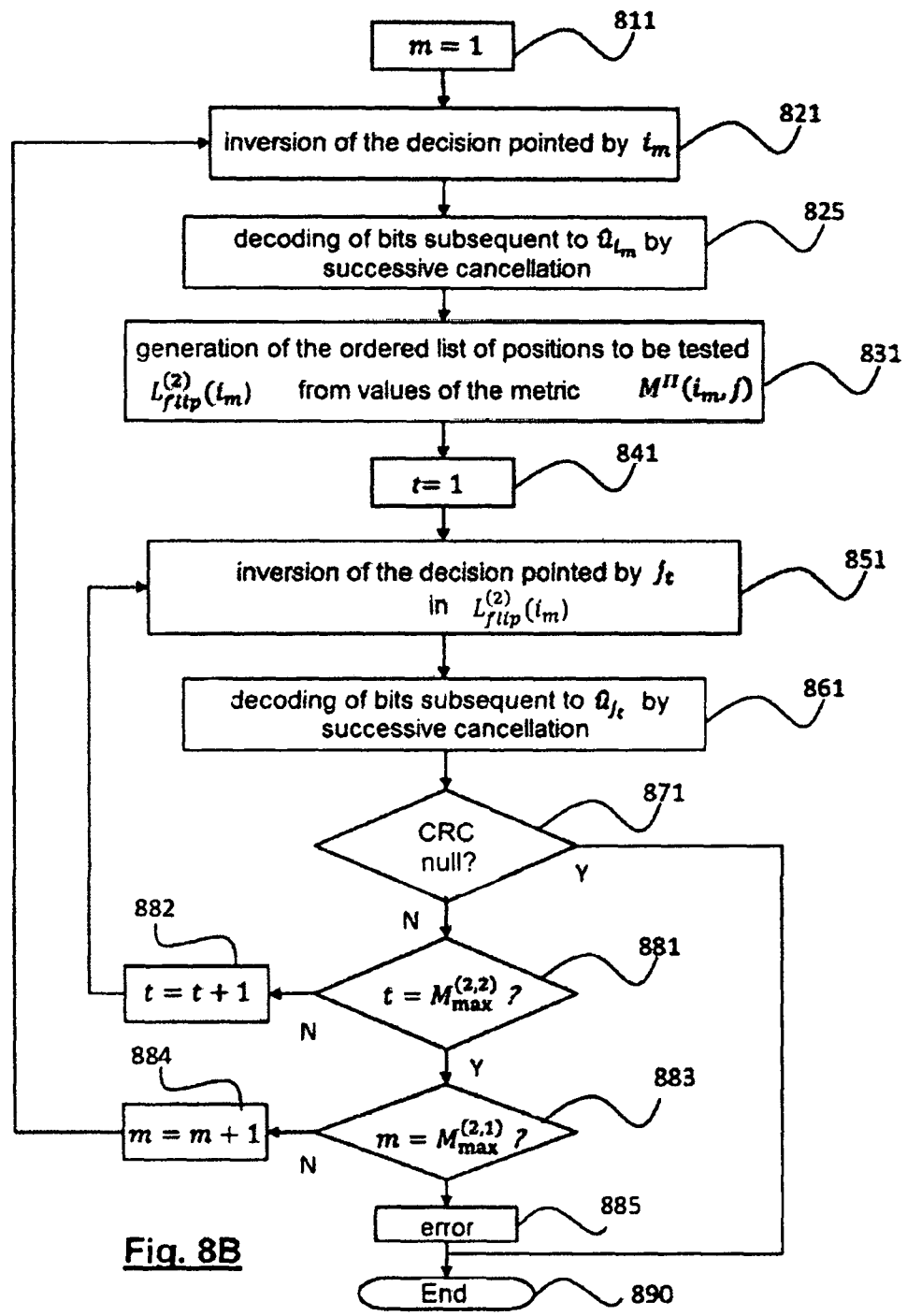

FIGS. 8A and 8B diagrammatically represent a flowchart of a polar code decoding method according to a second embodiment of the invention. FIG. 8A represents an order 1 inversion pass and FIG. 8B represents an order 2 inversion pass.

This second embodiment of the invention is different from the first in that, if all the inversions of bits at positions given in the list $L_{flip}$ led to an incorrect CRC, in other words in the case of a decoding error by inverting a single bit at a time, a second pass is made in which two bits are inverted. An expert in the subject will understand that in general, it will be possible to chain P inversion passes, the first pass only making order 1 inversions and the second pass order 2 inversions, the $P^{th}$ pass making order P inversions.

The first pass represented on FIG. 8A is identical to that in FIG. 5. Steps 810 to 880 are identical to steps 510 to 580 described above. The list of positions to be tested during the first pass and the number of these positions are denoted $L_{flip}^{(1)}$ and $M_{max}^{(1)}$ respectively. It will be observed that if the CRC is correct in step 820 or 870, decoding was successful during the first pass and the process stops at 890. On the other hand, if decoding failed at the end of test 880, a second pass represented in FIG. 8B is made.

In this second pass, the pointer in the list $L_{flip}^{(1)}$ is initiated once again in step 811, namely m=1.

The bit pointed at by the first position is then inverted, in other words $\hat{u}_{i_m}$ is inverted in 821 and subsequent bits are decoded by successive cancellation in 825. Considering that the first pass failed, it is known that the CRC failed. Consequently, a second ordered list $L_{flip}^{(2)}(i_m)$ of bits subsequent to $\hat{u}_{i_m}$ is generated directly in 831, making use of a second error metric $M^{II}(i_m, j)$.

The second error metric is similar to the first error metric, except that only decisions made on bits starting from position $i_m+1$ are taken into account, namely for the different first error metrics $M_1, M_2, M_3$ envisaged in (9), (13), (14):

$$M_1^{II}(i_m, j) = \qquad (20\text{-}1)$$
$$|LLR(j)| + \alpha^{II} \cdot S \cdot \text{Card}\{i \in [i_m+1, \ldots, j-1], |LLR(i)| < S\}$$

$$M_2^{II}(i_m, j) = |LLR(j)| + \alpha^{II} \cdot \sum_{i=i_m+1}^{j-1} \exp(-\beta|LLR(i)|) \qquad (20\text{-}2)$$

$$M_3^{II}(i_m, j) = \frac{1}{1+e^{\alpha^{II}|LLR(j)|}} \sum_{i=i_m+1}^{j-1} \frac{1}{1+e^{-\alpha^{II}|LLR(i)|}} \qquad (20\text{-}3)$$

In which $0<\alpha^{II}\leq 1$ is a weighting factor for the second metric, that may or may not be equal to $\alpha$.

In the simplified practical case in which LLR values are quantified, the second metric can be in the form:

$$M_3^{II}(i_m, j) = \qquad (20\text{-}4)$$
$$\begin{cases} 0 \text{ if } |LLR(j)| > S \\ \dfrac{f_j(-|LLR(j)|)}{f_j(-LLR(j))+f_j(LLR(j))} \prod_{i \in \Omega_{i_m,j}} \dfrac{f_i(-|LLR(i)|)}{f_i(-LLR(i)) + f_i(LLR(i))} \text{ otherwise} \end{cases}$$

in which $\Omega_{i_m,j}$ is the set of indices $i_m<i<j$ such that $|LLR(i)|\leq S$ and with the same notation as before.

It should be noted that the metric chosen for the second error is not necessarily of the same type as the metric chosen for the first error.

Scanning of positions for the second inversion is started in step 841, by initialising a second pointer t=1. An inversion is made in step 851, for the bit pointed to by the second pointer, in other words, the bit $\hat{u}_{j_t}$ is inverted and decoding is done in 861 by successive cancellation of this bit.

A test is made in 871 to see if the CRC checks. If it does, the second decoding pass is successful and the process stops at 890. If it does not, the next step in 881 is to test in list $M_{max}^{(2,2)}$ to see if all second positions in list $L_{flip}^{(2)}(i_m)$ have been considered. If they have not, the second pointer is incremented in 882, namely t=t+1. On the other hand, if all bits have been tested in $L_{flip}^{(2)}(i_m)$ positions, it is checked in 883 to see if the $M_{max}^{(2,1)}$ first positions of $L_{flip}^{(1)}$, have been tested, in which $M_{max}^{(2,1)} \leq M_{max}^{(1)}$ is a predetermined maximum number of first positions that can be inverted during the second pass. If this is not the case, the first pointer is incremented in 884 and the process returns to step 821 to make an inversion at the next position in the list $L_{flip}^{(1)}$. On the other hand, if all values in the list $L_{flip}^{(1)}$ have been considered, decoding is declared incorrect in 885 and the process is terminated in 890.

This second embodiment is characterised by a total allowable number of inversions $N_{max}^{inv}=M_{max}^{(1)}+M_{max}^{(2,1)}M_{max}^{(2,2)}$ and consequently a maximum number of SC decoding events equal to $N_{max}^{dec}=N_{max}^{inv}+1$.

Figure 9:
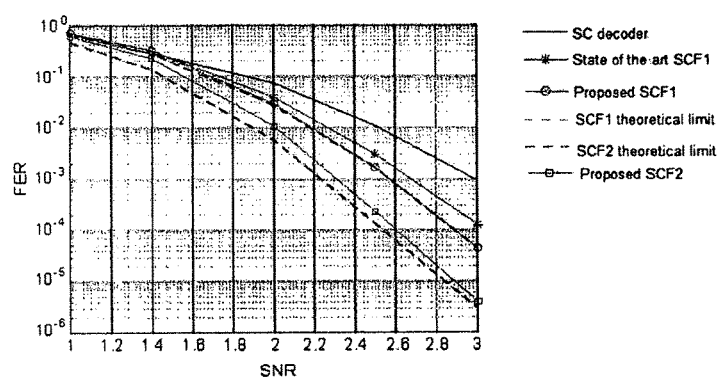
FIG. 9 represents a frame error rate (FER) as a function of the signal-to-noise (SNR) ratio for decoding methods according to the first and second embodiments of the invention and for decoding methods known from the state of the art.

FIG. 9 represent a frame error rate (FER) as a function of the signal-to-noise (SNR) ratio for decoding methods according to the first and second embodiments of the invention and for decoding methods known according to the state of the art.

The size of the polar code used was N=1024 with K=512 information bits and 16 CRC bits.

Figure 1A:
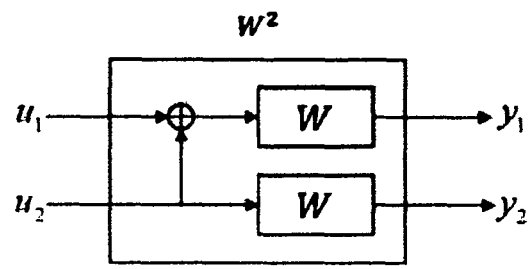
FIG. 1A diagrammatically represents an order 2 virtual channel obtained by combination of real channels.
Figure 1B:
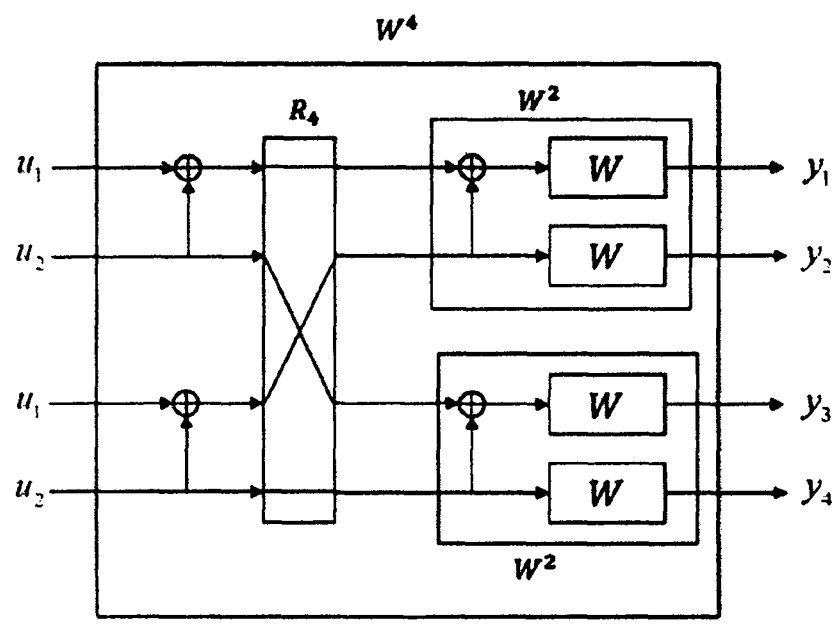
FIG. 1B diagrammatically represents an order 4 virtual channel obtained by combination of real channels.
Figure 2:
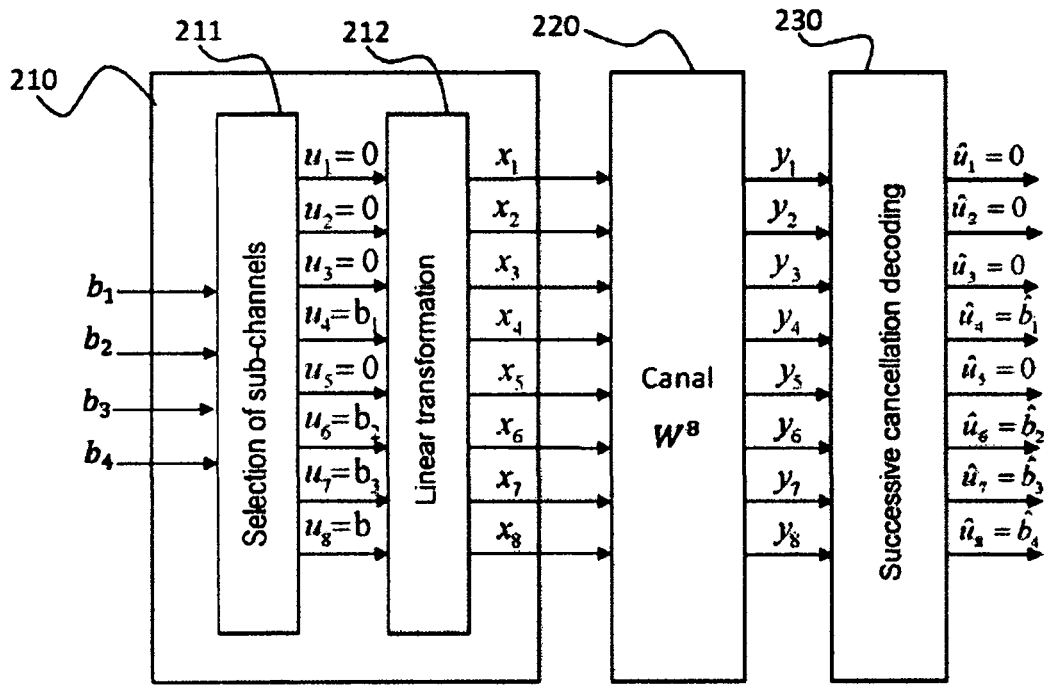
FIG. 2 diagrammatically shows an example of a polar code coding and decoding system according to the state of the art.
Figure 3:
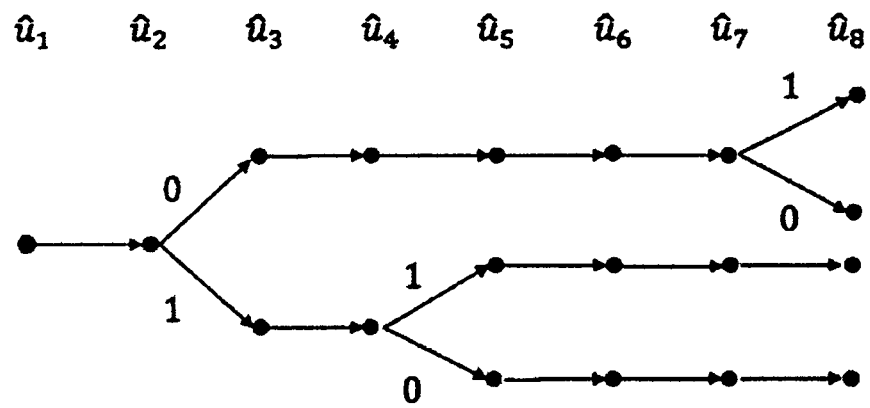
FIG. 3 diagrammatically shows an example of successive list decoding of a polar code, known in the state of the art.
Figure 4:
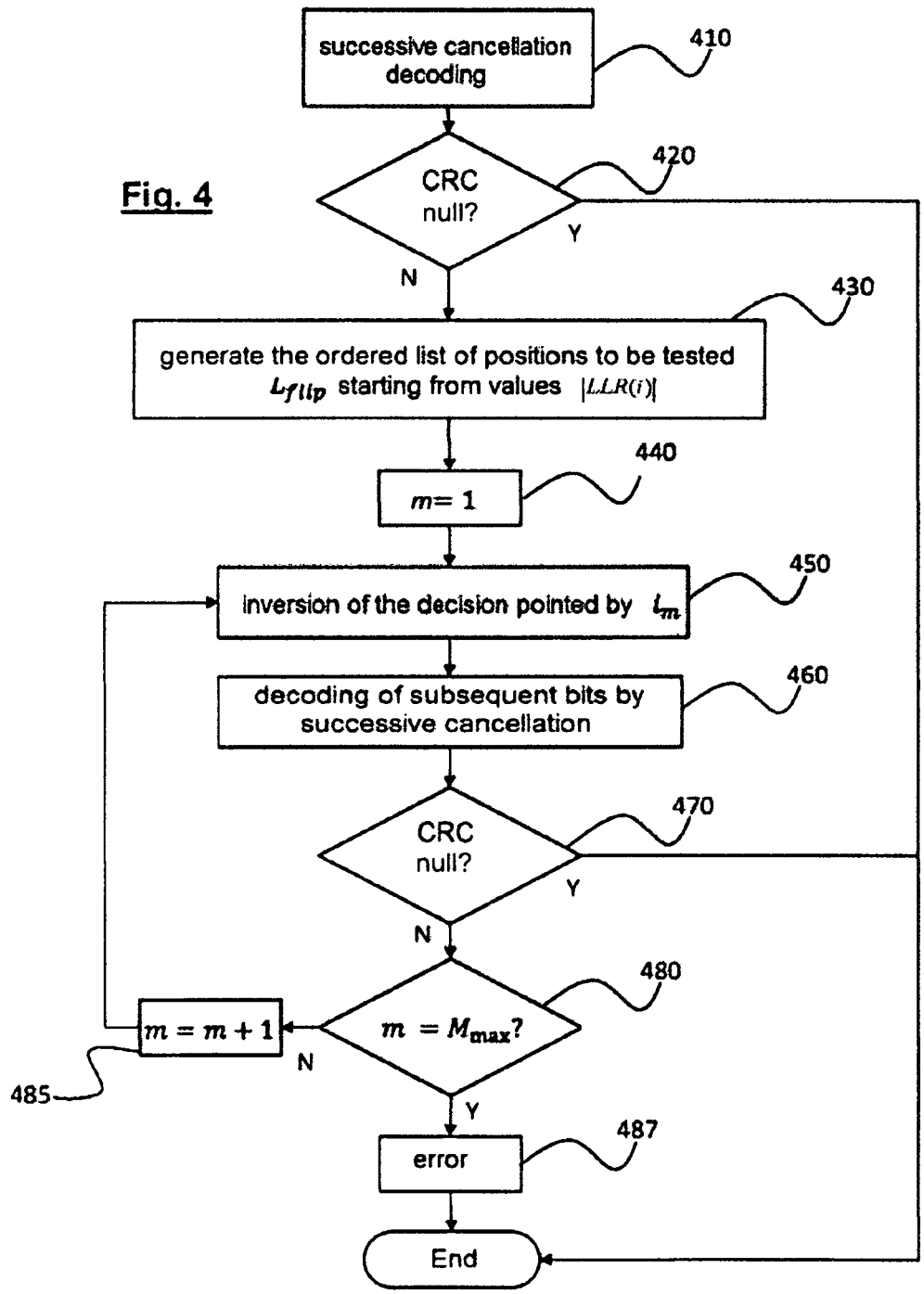
FIG. 4 diagrammatically shows a flowchart of an inversion method of decoding a polar code, known from the state of the art.

Curve 910 corresponds to a successive cancellation decoding (consequently without CRC) known in the state of the art, curve 920 corresponds to inversion coding, also known in the state of the art (SCF1), described with reference to FIG. 4.

Curve 930 corresponds to inversion decoding according to the first embodiment of the invention (using the above-mentioned metric $M_3$, $M_{max}$=20, $\alpha$=0.3) and curve 940 represents the theoretical limit of SCF1 decoding ($M_{max}$=K, infallible CRC). It can be seen that curve 930 is very close to curve 940 and that consequently, the proposed decoding has practically reached the theoretical limits of this type of decoding. A gain in the FER is observed. Furthermore and more significantly, the number of inversions is divided by a factor of 2 to 3, that significantly reduces the latency.

For comparative purposes, 960 represents the theoretical limit of FER for a perfect SCF2 decoding with two inversions ($M_{max}^{(1)}$=$M_{max}^{(2,1)}$=$M_{max}^{(2,2)}$=K, infallible CRC). It will be noted that although the decoding performance according to the first embodiment is significantly better than the state of the art, it still significantly lower than the theoretical limit of SCF2. However, this limit is satisfactorily approached by the decoding method according to the second embodiment of the invention (using the metric $M_3$ both for the first inversion and for the second inversion), the performance curve of which is given in 950.

Figure 10:
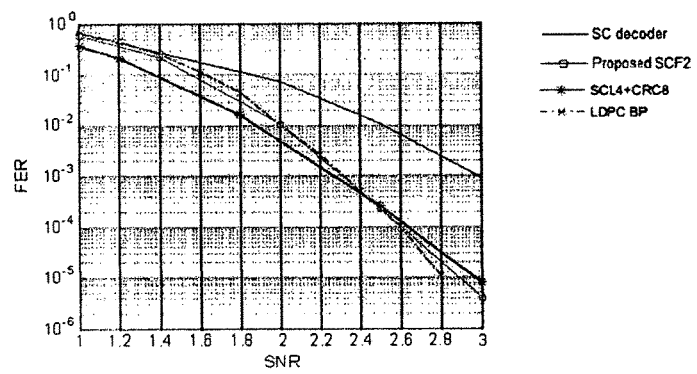
FIG. 10 represents a frame error rate as a function of the signal-to-noise ratio for the decoding method according to the second embodiment compared with an SCL decoding method known from the state of the art.

FIG. 10 represents a frame error rate as a function of the signal-to-noise ratio for the decoding method according to the second embodiment of the invention, in comparison with an SC list decoding method, SCL4+CRC8 (CRC size equal to 8 and list size equal to 4) and an LDPC belief propagation (LDPC-BP) decoding method. Curve 1010 corresponds to conventional SC decoding, curve 1020 corresponds to decoding according to the second embodiment, curve 1030 to decoding according to SCL4+CRC8 and curve 1040 to LDPC-BP decoding with the same parameters N and K as the polar code (the number of iterations used was taken equal to 100). It will be noted that the second embodiment achieves a performance level comparable to list decoding or to LDPC belief propagation for significantly lower complexity.

As mentioned above, the embodiment illustrated in FIGS. 8A and 8B can be generalised to an inversion pass of order P. More precisely, when the order P–1 inversion pass has failed, in other words when it has not been possible to make an SC decoding leading to a null CRC after all order P–1 inversion configurations have been considered, inversion configurations of order P will be considered.

However, scanning inversion configurations of order P is not necessarily optimal if the sort of order P–1 inversion configurations is followed. Thus for example, in the case of FIGS. 8A and 8B, where P=2, if $i_m$ and $i_{m+1}$ are two successive positions in the list $L_{flip}^{(1)}$, in which $M^1(i_m)<M^1(i_{m+1})$ (first variant with exploration following increasing metric values), the second error metric of a position j of $L_{flip}^{(2)}(i_m)$, namely $M_1^{II}(i_m,j)$, will not necessarily be less than the second error metric of a position j' of $L_{flip}^{(2)}(i_{m+1})$, namely $M_1^{II}(i_{m+1},j')$. In other words, the lexicographic order in the set $\mathcal{E}_2=\{(i, j)|i \in L_{flip}^{(1)}, j \in L_{flip}^{(2)}(i)\}$ of order 2 inversion configurations does not necessarily lead to an optimum latency. This can be overcome by sorting the set $\mathcal{E}_2$ of order 2 inversion configurations using a metric $M_1^{(2)}$ (alternatively $M_2^{(2)}$, $M_3^{(2)}$), as defined below.

In general, the set $\mathcal{E}_P$ of order P inversion configurations can be sorted using a metric $M_1^{(P)}$ (alternatively to using a metric $M_2^{(P)}$ or $M_3^{(P)}$) obtained by recurrence.

More precisely, the value of the metric $M_1^{(P)}$ (or $M_2^{(P)}$, $M_3^{(P)}$) associated with an inversion configuration $\varepsilon^{(P)}=(i_1, i_2, \ldots, i_{P-1}, i_P)$ in which $i_1<i_2<\ldots<i_p$ is deduced from the value of the metric $M_1^{(P-1)}$ (or $M_2^{(P-1)}, M_3^{(P-1)}$) of the inversion configuration $\varepsilon^{(P-1)}=(i_1,i_2, \ldots i_{p-1})$ and LLR values of bits $k=i_{p-1},i_{p-1}+1,\ldots,i_p$ of the frame obtained by SC decoding of bits subsequent to $u_{i_{p-1}}$ after decisions on bits at positions $i_1,i_2,\ldots i_{P-1}$ have been inverted (in other words after having inverted $\hat{u}_{i_1}, \hat{u}_{i_2}, \ldots, \hat{u}_{i_{P-1}}$), hereinafter denoted $LLR(\varepsilon^{(P-1)},k)$, $k=i_{p-1},i_{p-1}+1,\ldots,i_p$. More precisely:

$$M_1^{(P)}(\varepsilon^{(P)}) = M_1^{(P-1)}(\varepsilon^{(P-1)}) + |LLR(\varepsilon^{(P)})| + \qquad (21\text{-}1)$$
$$\alpha^{(P)}S \cdot \text{Card}\{k \in [i_{P-1}+1, \ldots, i_P - 1], |LLR(\varepsilon^{(P-1)}, k)| < S\}$$

$$M_2^{(P)}(\varepsilon^{(P)}) = \qquad (21\text{-}2)$$
$$M_2^{(P-1)}(\varepsilon^{(P-1)}) + |LLR(\varepsilon^{(P)})| + \alpha^{(P)} \sum_{k=i_{P-1}+1}^{i_P-1} \exp(|LLR(\varepsilon^{(P-1)}, k)|)$$

$$M_3^{(P)}(\varepsilon^{(P)}) \mathrel{+}= M_3^{(P-1)}(\varepsilon^{(P-1)}) \cdot \frac{1}{1+\exp(\alpha^{(P)}|LLR(\varepsilon^{(P)})|)} \cdot \qquad (21\text{-}3)$$
$$\sum_{k=i_{P-1}+1}^{i_P-1} \frac{1}{1+\exp(-\alpha^{(P)}|LLR(\varepsilon^{(P)}, k)|)}$$

in which $LLR(\varepsilon^{(P)})=LLR(\varepsilon^{(P-1)},i_p)$ and in which $0<\alpha^{(P)}\leq1$ is a weighting factor of the $P^{ème}$ metric (the weighting factors of the successive weightings can all be equal to the same coefficient $\alpha$) and in which the above metrics are initialised by:

$$M_1^{(0)}(\varepsilon^{(0)})=0 \qquad (22\text{-}1)$$

$$M_2^{(0)}(\varepsilon^{(0)})=0 \qquad (22\text{-}2)$$

$$M_3^{(0)}(\varepsilon^{(0)})=1 \qquad (22\text{-}3)$$

respectively

It will be understood that inversion configurations will be scanned in order of increasing values of metric $M_1^{(P)}$ and $M_2^{(P)}$ deceasing values of metric $M_3^{(P)}$. It will also be noted that $M_1^{(P)}(\varepsilon^{(P-1)},k)>M_1^{(P-1)}(\varepsilon^{(P-1)})$, $M_2^{(P)}(\varepsilon^{(P-1)},k)>M_2^{(P-1)}(\varepsilon^{(P-1)})$, $M_3^{(P)}(\varepsilon^{(P-1)},k)<M_3^{(P-1)}(\varepsilon^{(P-1)})$, which ensures the monotonous nature of the metric when changing from a given order of inversion configuration to a higher order of inversion configuration. If all SC decoding attempts on the frame have failed by successively applying order P inversion configurations, in the order of their metric values, then order P+1 inversion configurations are considered; this continues until SC decoding of the frame is successful (null CRC) or until a predetermined maximum order $P_{max}$ is reached.

What is claimed is:

1. Method for decoding a polar code in which a first successive cancellation decoding step (510, 810) is done, and in which if it is detected that the decoded frame is incorrect (520, 820), there is generated (530,830) a first ordered list ($L_{flip}$) of positions in the frame for which a bit inversion is to be tested, and, for each position in the first list and in the order of the first list, the value of the bit in the frame corresponding to said position is inverted (550, 850), and a second successive cancellation decoding (560,860) is carried out for subsequent bits in the frame until there is no error in the decoded frame or the first list is exhausted, wherein the bits in the first list are ordered as a function of a first metric (M(k)), the value of said first metric for a bit in the frame dependent on the reliability of this bit and the reliability of decisions on at least one sub-set of bits preceding it in the frame.

2. Method for decoding a polar code according to claim 1, wherein the value of the first metric for the $k^{ème}$ bit in the frame is given by $M(k)=|LLR(k)|+\alpha.S.\text{Card}\{\Omega_k\}$ in which $\Omega_k$ is the set of indices $i<k$ such that $|LLR(i)|\leq S$, $LLR(i)$ is the logarithic likelihood ratio for the $i^{ème}$ bit in the frame, $S>0$ is a threshold value and $0<\alpha\leq1$ is a weighting factor.

3. Method for decoding a polar code according to claim 2, wherein the weighting factor α is chosen to be approximately equal to 1/S.

4. Method for decoding a polar code according to claim 1, wherein the value of the first metric for the $k^{ème}$ bit in the frame is given by $$M(k) = |LLR(k)| + \alpha \cdot \sum_{i=1}^{k-1} \exp(-\beta|LLR(i)|)$$

in which LLR(i) is the logarithmic likelihood ratio for the $i^{ème}$ bit in the frame, $0<\alpha \leq 1$ is a weighting factor and β is a forgetting factor.

5. Method for decoding a polar code according to claim 1, wherein the value of the first metric for the $k^{ème}$ bit in the frame is given by $$M(k) = \frac{1}{1 + e^{\alpha|LLR(k)|}} \sum_{i=1}^{k-1} \frac{1}{1 + e^{-\alpha|LLR(i)|}}$$

in which LLR(i) is the logarithmic likelihood ratio for the $i^{ème}$ bit in the frame, α is a weighting factor.

6. Method for decoding a polar code according to claim 1, wherein the value of the first metric for the kème bit in the frame is given by:

$$M(k) = \begin{cases} 0 \text{ if } |LLR(k)| > S \\ \frac{f_k(-|LLR(k)|)}{f_k(-LLR(k)) + f_k(LLR(k))} \prod_{i \in \Omega_k} \frac{f_i(-|LLR(i)|)}{f_i(-LLR(i)) + f_i(LLR(i))} \text{ otherwise} \end{cases}$$

in which $\Omega_k$ is the set of indices i<k such that |LLR(i)|≤S, LLR(i) is the logarithmic likelihood ratio for the $i^{ème}$ bit of the frame, S>0 is a threshold value and $f_i$ is the mass distribution function of the LLR(i) ratio quantified on a predetermined number of bits.

7. Method for decoding a polar code according to claim 1, wherein if all elements of the first list have been considered and the decoded frame is still incorrect, for each position ($i_m$) in the first list ($L_{flip}$), the bit in this first position (821) is inverted, a third successive cancellation of subsequent bits in the frame (825) is performed and a second ordered list of second positions ($L_{flip}^{(2)}(i_m)$) is generated (831), for which the inversion, combined with inversion of the bit $i_m$, is to be tested, the bits of the second list being ordered as a function of a second metric ($M^{II}(i_m,j)$), the value of the second metric for a bit in the frame dependent on the reliability of the decision on this bit and on the reliability of decisions on at least one subset of bits contained between the first positions $i_m$ and the second positions j, and that for each second position (j) in the second list, in the order of this second list, the bit at this second position is inverted and a fourth successive cancellation decoding is made on subsequent bits in the frame (861), the third decoding and the fourth decoding being repeated until the decoded frame no longer contains any errors or until the first list and the second lists associated with each of the first positions of the first list respectively have all been considered.

8. Method for decoding a polar code according to claim 7, wherein the value of the second metric for the $j^{ème}$ bit in the frame is given by $M^{II}(i_m, j)=|LLR(j)|+\alpha^{II}.S.\text{Card}\{\Omega_{i_m,j}\}$ in which $\Omega_{i_m,j}$ is the set of indices $i_m<i<j$ such that |LLR(i)|≤S, LLR(i) is the logarithmic likelihood ratio for the $i^{ème}$ bit in the frame, S>0 is a threshold value and $0<\alpha^{II}\leq 1$ is a weighting factor.

9. Method for decoding a polar code according to claim 8, wherein the weighting factor $\alpha^{II}$ is chosen to be approximately equal to 1/S.

10. Method for decoding a polar code according to claim 7, wherein the value of the second metric for the $j^{ème}$ bit in the frame is given by $$M^{II}(i_m, j) = |LLR(j)| + \alpha^{II} \cdot \sum_{i=i_m+1}^{j-1} \exp(-\beta|LLR(i)|)$$

in which LLR(i) is the logarithmic likelihood ratio for the $i^{ème}$ bit in the frame, $0<\alpha^{II}\leq 1$ is a weighting factor and β is a forgetting factor.

11. Method for decoding a polar code according to claim 7, wherein the value of the second metric for the $j^{ème}$ bit in the frame is given by $$M^{II}(i_m, j) = \frac{1}{1 + e^{\alpha^{II}|LLR(j)|}} \prod_{i=i_m+1}^{j-1} \frac{1}{1 + e^{-\alpha^{II}|LLR(i)|}}$$

in which LLR(i) is the logarithmic likelihood ratio for the $i^{ème}$ bit in the frame, $\alpha^{II}$ is a weighting factor.

12. Method for decoding a polar code according to claim 7, wherein the value of the second metric for the $j^{ème}$ bit in the frame is given by:

$$M_3^{II}(i_m, j) = \begin{cases} 0 \text{ if } |LLR(j)| > S \\ \frac{f_j(-|LLR(j)|)}{f_j(-LLR(j)) + f_j(LLR(j))} \prod_{i \in \Omega_{i_m,j}} \frac{f_i(-|LLR(i)|)}{f_i(-LLR(i)) + f_i(LLR(i))} \text{ otherwise} \end{cases}$$

in which $\Omega_{i_m,j}$ is the set of indices $i_m<i<j$ such that |LLR(i)|≤S, LLR(i) is the logarithmic likelihood ratio for the $i^{ème}$ bit of the frame, S>0 is a threshold value and $f_i$ is the mass distribution function of the LLR(i) ratio quantified on a predetermined number of bits.

13. Method for decoding a polar code according to claim 1, wherein it comprises a plurality of successive cancellation decoding passes, each order P pass being associated with a set $\mathcal{E}_p$ of inversion configurations, each inversion configuration of $\mathcal{E}_p$ being defined by a P-uplet $\varepsilon^{(P)}$ of ordered positions in the frame for which the bit inversion is to be tested, the order P pass comprising a successive cancellation decoding for each inversion configuration $\varepsilon^{(P)}$ of $\mathcal{E}_p$ starting from the bit following the bit in the last position of said inversion configuration ($u_{i_p+1}$), after the bits in said inversion configuration have been inverted, the set $\mathcal{E}_p$ of inversion configurations $\varepsilon^{(P)}$ being scanned according to a sort induced by a metric ($M^{(P)}$), the decoding method changing to the higher inversion order P+1 when all inversion configurations of the set $\mathcal{E}_p$ have been tested with any error in the decoded frame.

14. Method for decoding a polar code according to claim 13, wherein the inversion configurations $\varepsilon^{(P)}$ of $\mathcal{E}_p$ are sorted by increasing values, $M_1^{(P)}(\varepsilon^{(P)})$ of said order P metric, the value of said metric for a configuration $\varepsilon^{(P)}=(i_1, i_2, \ldots, i_{P-1}, i_p)$ being determined from the value of the order P−1 metric, $M_1^{(P-1)}$, the inversion configuration $\varepsilon^{(P-1)}=(i_1, i_2, \ldots, i_{P-31\ 1})$ of $\mathcal{E}_{P-1}$ and reliabilities of decisions on bits at positions $k=i_{P-1}+1, \ldots, i_p$ in the frame, by way of:

$$M_1^{(P)}(\varepsilon^{(P)})=M_1^{(P-1)}+|LLR(\varepsilon^{(P)})|+\alpha^{(P)}S.\text{Card}\ \{k \in [i_{p-1}+1, \ldots, i_p-1], |LLR(\varepsilon^{(P-1)},k)|<S\}$$

in which $0<\alpha^{(P)}\leq 1$ is a weighting factor of said order P metric, $S>0$ is a predetermined threshold value, and $LLR(\varepsilon^{(P-1)},k)$ is the reliability of the decision of the bit in position k after successive cancellation decoding of bits subsequent to the bit at position $i_{p-1}$, the bits at positions $i_1, i_2, \ldots, i_{P-1}$ of $\varepsilon^{(P-1)}$ having previously been inverted.

15. Method for decoding a polar code according to claim 13, wherein the inversion configurations $\varepsilon_{(P)}$ of $\mathcal{E}_p$ are sorted by increasing values, $M_2^{(P)}(\varepsilon^{(P)})$ of said order P metric, the value of said metric for a configuration $\varepsilon^{(P)}=(i_1, i_2, \ldots, i_{P-1}, i_p)$ being determined from the value of the order P−1 metric, $M_2^{(P-1)}$, the inversion configuration $\varepsilon^{(P-1)}=(i_1, i_2, \ldots, i_{P-1})$ of $\mathcal{E}_{P-1}$ and reliabilities of decisions on bits at positions $k=i_{P-1}+1, \ldots, i_p$ in the frame, by way of:

$$M_2^{(P)}(\varepsilon^{(P)}) = M_2^{(P-1)}(\varepsilon^{(P-1)}) + |LLR(\varepsilon^{(P)})| + \alpha^{(P)} \prod_{k=i_{p-1}+1}^{i_p-1} \exp(|LLR(\varepsilon^{(P-1)}, k)|)$$

in which $0<\alpha_{(P)}\leq 1$ is a weighting factor of said order P metric, and $LLR(\varepsilon^{(P-1)},k)$ is the reliability of the decision of the bit in position k after successive cancellation decoding of bits subsequent to the bit at position $i_{P-31\ 1}$, the bits at positions $i_1, i_2, \ldots, i_{P-1}$ of $\varepsilon^{(P-1)},k)$ having previously been inverted.

16. Method for decoding a polar code according to claim 13, wherein the inversion configurations $\varepsilon^{(P)}$ of $\mathcal{E}_p$ are sorted by decreasing values, $M_3^{(P)}$, of said order P metric, the value of said metric for a configuration $\varepsilon^{(P)}=(i_1, i_2, \ldots, i_{P-1}, i_p)$ being determined from the value of the order P−1 metric, $M_3^{(P-1)}$, the inversion configuration $\varepsilon^{(P-1)}=(i_1, i_2, \ldots, i_{P-1})$ of $\mathcal{E}_{P-1}$ and reliabilities of decisions on bits at positions $k=i_{P-1}+1, \ldots, i_p$ in the frame, by means of:

$$M_3^{(P)}(\varepsilon^{(P)}) = M_3^{(P-1)}(\varepsilon^{(P-1)}) \cdot \frac{1}{1+\exp(\alpha^{(P)}|LLR(\varepsilon^{(P)})|)} \cdot \prod_{k=i_{p-1}+1}^{i_p-1} \frac{1}{1+\exp(-\alpha^{(P)}|LLR(\varepsilon^{(P)}, k)|)}$$

in which $0<\alpha^{(P)}\leq 1$ is a weighting factor of said order P metric, and $LLR(\varepsilon^{(P-1)},k)$ is the reliability of the decision of the bit in position k after successive cancellation decoding of bits subsequent to the bit at position $i_{P-1}$, the bits at positions $i_1 i_2, \ldots, i_{P-1}$ of $\varepsilon^{(P-1)}$ having previously been inverted.

* * * * *